US007167007B2

(12) United States Patent
Coffeen et al.

(10) Patent No.: US 7,167,007 B2
(45) Date of Patent: *Jan. 23, 2007

(54) APPARATUS AND METHOD FOR FIELD TESTING MOV ARRESTERS

(75) Inventors: Larry T. Coffeen, Jackson, GA (US); Eric M. Angeli, Kennesaw, GA (US)

(73) Assignee: Georgia Tech Research CorporationGA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/099,909

(22) Filed: Apr. 6, 2005

(65) Prior Publication Data

US 2005/0231881 A1 Oct. 20, 2005

Related U.S. Application Data

(60) Provisional application No. 60/560,052, filed on Apr. 7, 2004.

(51) Int. Cl.
*G01R 31/08* (2006.01)
(52) U.S. Cl. ............... 324/522; 324/551; 324/537; 324/547; 361/40
(58) Field of Classification Search ............... 324/500, 324/522, 537, 547, 551; 361/40
See application file for complete search history.

(56) References Cited

U.S. PATENT DOCUMENTS 3,050,681 A    8/1962   Bhimani ............... 324/554
4,803,436 A *   2/1989   Kresge et al. ............ 324/549
5,087,885 A *   2/1992   Bergstrom ............... 324/547

FOREIGN PATENT DOCUMENTS

JP           06082506 A   *   3/1994

OTHER PUBLICATIONS

Coffeen, Larry T., et al., "High Voltage AC Resistive Current Measurements Using a Computer Based Digital Watts Technique", IEEE Transactions on Power Delivery, vol. 6, No. 2, Apr. 1991, pp. 550-556.

* cited by examiner

*Primary Examiner*—Andrew Hirshfeld
*Assistant Examiner*—Marina Kramskaya
(74) *Attorney, Agent, or Firm*—Thomas, Kayden, Horstemeyer & Risley, LLP

(57) ABSTRACT

Embodiments test MOV arresters. One embodiment comprises applying a plurality of voltages to a high voltage lead of the MOV arrester, the plurality of voltages being changed between an initial test voltage and final test voltage (corresponding to a point of conduction of a reference MOV arrester); determining a resistive current through the MOV arrester for each of the voltages; determining information corresponding to the resistive current when the applied test voltage corresponds to the point of conduction of the reference MOV arrester; comparing the determined information with information associated with the point of conduction of the reference MOV arrester; determining that the MOV arrester has passed the test when the determined information corresponds to the information associated with the reference MOV arrester; and determining that the MOV arrester has failed the test when the determined information does not correspond to the information associated with the reference MOV arrester.

49 Claims, 7 Drawing Sheets

APPARATUS AND METHOD FOR FIELD TESTING MOV ARRESTERS

CROSS-REFERENCE TO RELATED APPLICATIONS

This application claims priority to now abandoned U.S. provisional application entitled, "PASS/FAIL TECHNIQUE TO DETERMINE DIELECTRIC INTEGRITY OF POLYMER INSULATORS & GAPLESS MOV LIGHTNING ARRESTERS," having Ser. No. 60/560,052, filed Apr. 7, 2004, which is entirely incorporated herein by reference.

This application is related to co-pending commonly assigned Non-Provisional Application entitled, "APPARATUS AND METHOD FOR FIELD TESTING POLYMER INSULATORS," filed concurrently herewith on Apr. 6, 2005, and accorded Ser. No. 11/100,127, which is hereby incorporated herein by reference in its entirety.

TECHNICAL FIELD

Embodiments of the field testing unit are generally related to electric utility power system device testing, and, more particularly, is related to a system and method for field testing polymer insulators.

BACKGROUND

Current practices in the electric utility industry are increasingly seeing the necessity to install replacement transmission facilities, such as line insulators, while the line is energized. For example, a utility may have their personnel replace aged or contaminated porcelain or polymer insulators with new, replacement polymer insulators. The replacement of the existing insulator with the new polymer insulator, in some situations, may be done while the line remains energized (operating at its design voltage).

There have been incidents where a newly installed polymer insulator immediately failed when initially energized. For personnel safety purposes, utilities may require that the electrical integrity of each insulator be tested and verified before replacement under energized conditions. To accomplish this, the utility tests the insulators individually at a location remote from the installation site, such as at a high voltage test facility. The testing process is tedious, time consuming, and can only accommodate a limited number of insulators at a time.

Once the insulators are tested, they are tagged and sent to the worksite or stored for future use. Once the insulators leave the test facility, it is very possible for conditions to occur that may subsequently compromise the electrical integrity of the insulator. A safer and more appropriate test procedure would be to test the polymer insulators on-site immediately before installation.

FIG. 1 is a block diagram of an embodiment of a prior art test system. The prior art test device 102 is coupled to the polymer insulator 104 at the ground lead 106, via connection 108. The high voltage lead 110 is coupled to a high voltage source 112, typically at a value that corresponds to the intended operating voltage of the polymer insulator 104.

The polymer insulator 104 consists of a plurality of sheds 114 coupled together in a linear fashion as shown. The size of a shed 114 (diameter and thickness), and the number of sheds 114 used in any particular polymer insulator 104, may be designed such that the polymer insulator 104 may be used at a desirable operating voltage. Furthermore, great design flexibility is available such that the polymer insulator 104 may be connected to a power line structure (e.g.: pole, tower or the like) and the energized conductor in a variety of manners. It is appreciated that the simplified illustrative diagram of the polymer insulator 104 having five sheds 114 is indented for illustration purposes to demonstrate testing techniques and issues.

Prior art test devices 102 are not suitable for testing modern, high resistance, polymer insulators for "good-as-new" condition. Typically, prior art test devices 102 are used in a laboratory or test facility environment to test insulators with much larger leakage component currents.

During testing, a voltage is applied to the polymer insulator 104 at high voltage lead 110 such that an electric field (not illustrated) is established around the polymer insulator. The prior art test device detects leakage currents ($I_{insulation}$, $I_{stray}$ and $I_{surface}$). If the polymer insulator 104 is properly functioning, the total detected leakage current will be less than a specified threshold. Here, currents $I_{insulation}$ is a leakage current component traveling through the internal portions of the polymer insulator 104. $I_{stray}$ are capacitive type leakage currents established through the surrounding air. $I_{surface}$ is a leakage current flowing over the surface of the sheds 114.

One difficulty in the illustrated test system of FIG. 1 is that the polymer insulator 104, when tested, may be in close proximity to an object 116. $I_{stray}$ components are established between the proximity object 116 and the polymer insulator 104 during testing. Furthermore, various $I_{stray}$ components from the high voltage lead 110, the sheds 114, the prior art test device 102 and ground are established. There is no practical way to predict the magnitude or effect of these $I_{stray}$ components on the test result. Electrically, these random stray currents cause a phase shift in the total measured leakage current. These unpredictable $I_{stray}$ components, which cannot be easily measured or detected, may cause significant test result errors when testing modern polymer insulators that have an electrical impedance dominated by high resistance.

Furthermore, applying a high voltage to the high voltage test lead 110 may be dangerous to the testing personnel in the event of an accident. Typically, an accident during high voltage testing may significantly injure or may be fatal to the victim of the accident. Accordingly, testing at a test laboratory or test facility is difficult because of safety issues and the associated testing procedures that must be followed during the test.

It may also be desirable to test other electric system devices before installation. For example, protective devices such as metal oxide varistor (MOV) arresters are used to protect transmission facilities from sudden voltage surges, such as might be caused by a lightning strike or system disturbance. During transportation from the test site to the field location, the MOV arrester may become damaged if jarred or vibrated, as may occur when transported to a remote site over rough unimproved roads or trails. However, such damage may not be visibly apparent to the personnel installing the MOV arrester. Or, over time, the insulating characteristics of the MOV arrester may degrade before time to install in an energized line. In addition, MOV arresters degrade in service over time as a result of protecting transmission facilities from sudden voltage surges. If such defective or degraded MOV arresters remain in service, they may fail catastrophically or not be able to provide the intended protection to the electric transmission system. Upon failure during a voltage surge event, other system facilities may be damaged because the MOV arrester did not properly function.

MOV arresters may be tested at the remote facilities, much like the above-described polymer insulators 104. However, the testing process is tedious, time consuming, and can only accommodate a limited number of MOV arresters at a time.

SUMMARY

Embodiments of the field test system provide a system and method for testing metal oxide varistor (MOV) arresters. Briefly described, one embodiment comprises applying a plurality of applied voltages to a high voltage lead of the MOV arrester, the plurality of applied voltages being changed between an initial test voltage and final test voltage, the final test voltage corresponding to a point of conduction of a reference MOV arrester; determining a resistive current through the MOV arrester for each of the applied voltages; determining information corresponding to the resistive current when the applied test voltage corresponds to the point of conduction of the reference MOV arrester; comparing the determined information with information associated with the point of conduction of the reference MOV arrester; determining that the MOV arrester has passed the test when the determined information corresponds to the information associated with the reference MOV arrester; and determining that the MOV arrester has failed the test when the determined information does not correspond to the information associated with the reference MOV arrester.

Another embodiment comprises a power supply controller configured to: receive power from a power supply; regulate a voltage received from the power supply into a plurality of regulated voltages; and change the plurality of regulated voltages by a predefined incremental amount in step-wise manner; comprises a power supply transformer configured to couple to a high voltage lead of a MOV arrester so that the plurality of regulated voltages received from the power supply controller are transformed into a plurality of applied voltages that are applied to the high voltage lead; and comprises a processing system configured to: determine information corresponding to resistive current through the MOV arrester at each of the plurality of applied voltages between an initial test voltage and final test voltage, the final test voltage corresponding to a point of conduction of a reference MOV arrester; compare the determined information with information associated with a reference MOV arrester; determine that the MOV arrester has passed the test when the determined information corresponds to the information associated with the reference MOV arrester; and determine that the MOV arrester has failed the test when the determined information does not correspond to the information associated with the reference MOV arrester.

BRIEF DESCRIPTION OF THE DRAWINGS

The components in the drawings are not necessarily to scale relative to each other. Like reference numerals designate corresponding parts throughout the several views.

DETAILED DESCRIPTION

Figure 2:
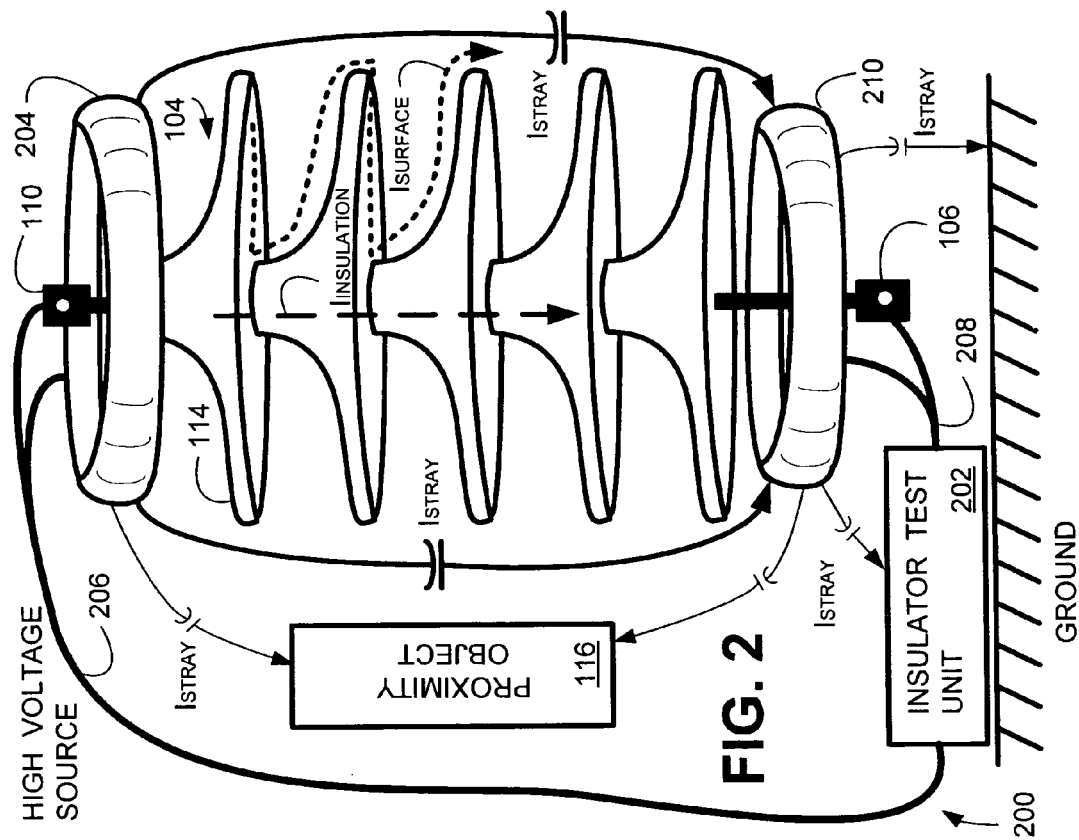
FIG. 2 is a block diagram of an embodiment of the field test system coupled to a polymer insulator having a plurality of sheds.

FIG. 2 is a block diagram of an embodiment of the field test system 200 coupled to a polymer insulator 104 having a plurality of sheds 114. The field test system 200 employs an insulator test unit 202 and a high voltage grading shield. A controlled high voltage is applied to high voltage grading shield by the insulator test unit 202, via connection 206. Connection 206 is also coupled to the high voltage lead 110. The insulator test unit 202 is coupled to the ground lead 106, via connection 208. An optional low voltage grading shield may also be coupled to connection 208.

Grading shields, shown in one embodiment as corona rings 204 and 210, are oriented generally as illustrated, thereby establishing a more uniform electric field (not shown) about the polymer insulator 104 during test conditions. Thus, one corona ring 204 is oriented about upper region of the polymer insulator. Another corona ring 210 is oriented about a lower region of the polymer insulator in another embodiment. Other embodiments may use any suitable grading shield or grading device.

During test conditions, the random $I_{stray}$ components between the sheds 114, the proximity object 116, the insulator test unit 202 and ground are minimized (graphically depicted by the relatively light lead lines). $I_{stray}$ components between the corona rings 204 and 210 are controlled and are not random (graphically depicted by the relatively dark lead lines). The stray capacitance ($C_{stray}$) resulting from the geometry of and/or the orientation of the grading shield devices is bounded on the low end by a relatively low stray capacitance and on the upper end by a relatively high stray capacitance. The minimum shielding capacitance required should produce controlled $I_{stray}$ from the high voltage grading shield to a ground shield that is much greater than the $I_{stray}$ of the proximity coupling, shed to ground coupling, and insulator unshielded end effects of electric field distribution, especially at the high voltage source end. The maximum shielding allowed is set by the effective bits of resolution of the signal digitizer 308 (FIG. 3), the sampling rate of the signal digitizer 308 and the phase accuracy of the voltage divider 306 and connection leads 206 and 208. For a given signal digitizer 308, voltage divider 306, and connection leads 206 and 208, the working range for the controlled $I_{stray}$ is between the limits stated above. In one embodiment, a leakage current between 50 micro amps and 150 micro amps for a 9-bit digitizer, set at 100 kHz sample rate using a voltage divider with less than 4 minutes of phase error and a non-inductive current shunt, is sufficient. In one embodiment, a pair of 10 inch diameter corona rings are used as grading shields. Since the random and unpredictable $I_{stray}$ components are minimized and upper and lower boundaries are set on the $C_{stray}$, the $I_{insulation}$ and $I_{surface}$ may be directly measured with a high degree of accuracy and repeatability by the field test system 200.

Figure 3:
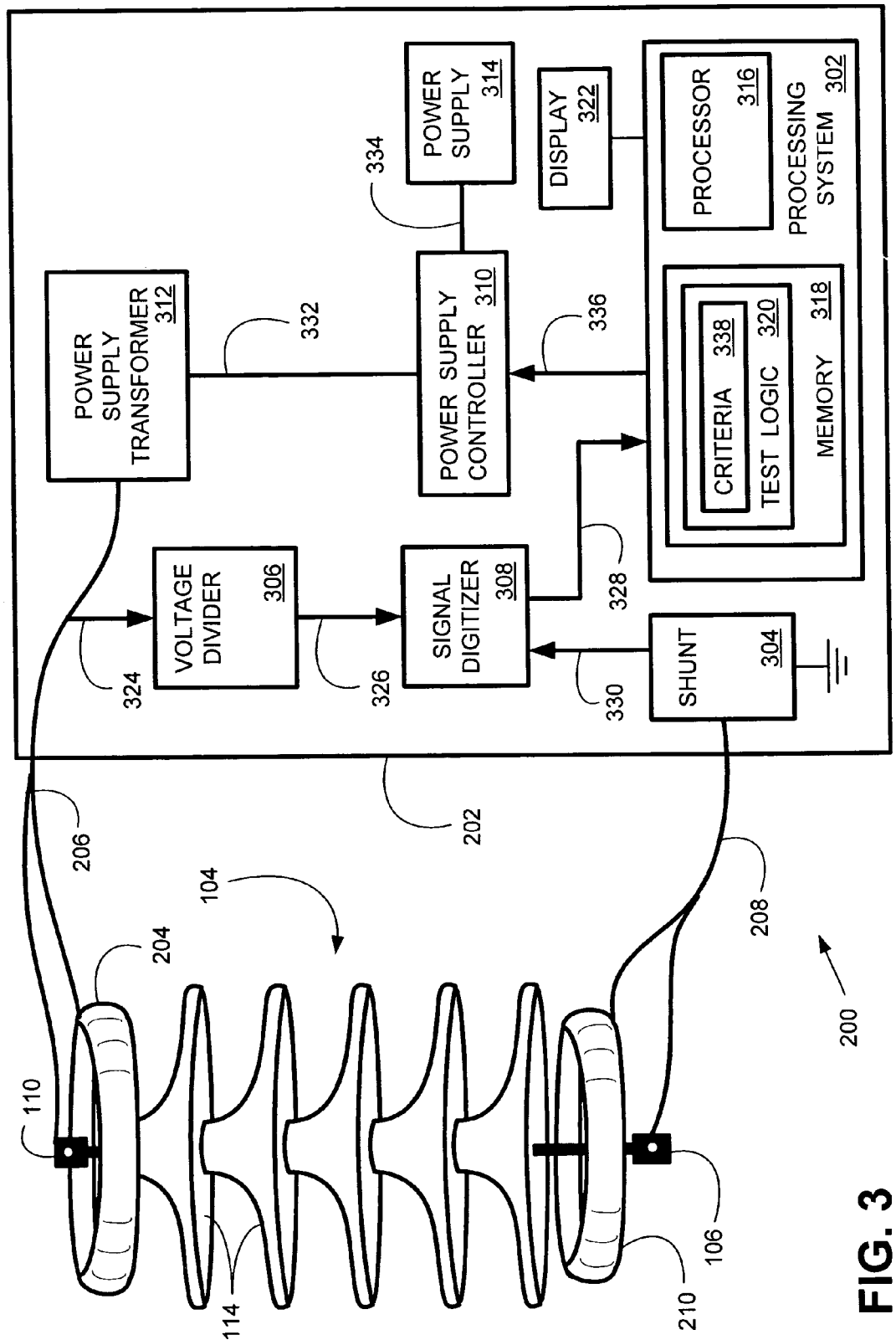
FIG. 3 is a block diagram illustrating further detail of an embodiment of the field test system.

FIG. 3 is a block diagram illustrating further detail of an embodiment of the field test system 200. The insulator test unit 202 includes a processing system 302, a shunt 304, a voltage divider 306, a signal digitizer 308, a power supply controller 310, a power supply transformer 312 and an optional power supply 314. Processing system 302 further includes at least a processor 316 and a memory 318, where the test logic 320 resides. An optional display 322 may be included.

It is appreciated that the above-described components of the field test system 200 may reside together in a single enclosure, or selected components may be grouped conveniently into separate enclosures. For example, in one embodiment, the processing system 302 and display 322 is a commercially available laptop or notebook type computer that is easily used in the field and that is conveniently portable. In another embodiment, the power supply 314 is a portable generator or an external power supply. In another embodiment, the signal digitizer 308 may be a suitable commercially-available oscilloscope or other similar type device.

During testing of the polymer insulator 104, predetermined high voltages are applied to the corona ring 204 and the high voltage lead 110 in a specified manner, described in greater detail hereinbelow. During the test, the voltage divider 306, coupled to connection 206 via connection 324, detects the applied voltage. The voltage divider 306 steps-down the detected voltage to a voltage that is within the digitizing range of the signal digitizer 308 using a suitable voltage divider ratio. Any suitable voltage divider device may be used such that voltages over the test range may be converted into voltages that can be digitized. In one embodiment, the ratio error is less than 2% and the phase error is less that 4 minutes.

The voltage divider 306 provides the stepped-down voltage to the signal digitizer 308, via connection 326. The signal digitizer 308 generates from the analog voltage received from the voltage divider 306 a digitized signal. This digitized signal is communicated to the processing system 302, via connection 328. Accordingly, the digitized signal corresponds to the test voltage applied to corona ring 204 and the high voltage lead 110 of the polymer insulator 104. The signal digitizer 308 is configured with a suitable sampling rate such that the provided digital signals are discernable to the processing system 302.

Shunt 304 is coupled to the ground lead 106, and the optional corona ring 210, if used via connection 208. Shunt 304 is a low inductance resistor in one embodiment. Thus, any current flowing through or over the polymer insulator 104 is transferred onto connection 208. Shunt 304 converts the detected current into a suitable voltage signal that is communicated to the signal digitizer 308, via connection 330. The signal digitizer 308 generates from the detected analog voltage signal provided by the shunt 304 another digitized signal that is communicated to the processing system 302. Accordingly, the other digitized signal corresponds to detected leakage current flowing through and/or over the polymer insulator 104, in addition to fixed capacitive stray currents. In one embodiment, the total leakage current is detected.

Information corresponding to the test voltage and the detected leakage current are both required to determine the resistive component of current in the processing system 302. One embodiment uses the digitized test voltage signal and the digitized leakage current signal.

The power supply controller 310 receives power from the power supply 314, via connection 334, and precisely regulates the voltage output onto connection 332. The power supply transformer then transforms the received regulated voltage from the power supply controller 310 to a high voltage that is applied through connection 206. Since the winding ratio of the power supply controller 310 is a precisely known value, the applied high voltage on connection 206 is known.

Furthermore, since the voltage divider 306 and signal digitizer 308 are providing a highly accurate measurement of the applied voltage on connection 206 to processing system 302, processing system 302 can generate and communicate a control signal to the power supply controller 310, via connection 336, to cause further adjustments to the voltage output on connection 332. Accordingly, the applied voltage on connection 206 may be further controlled to a highly accurate and known value. In one embodiment, this value is a specified test voltage.

As an illustrative example of controlling the applied voltage, consider an embodiment where the power supply 314 is a portable power generator or an external power system which provides 120 volts alternating current (AC), at 60 hertz (Hz). It is appreciated that the received voltage from the power supply 314 may be provided within a range of ±10% of the nominal 120 volt operating voltage. Furthermore, the value of the provided AC voltage may fluctuate with time.

The power supply controller 310 may precisely regulate the received voltage to a voltage between zero volts and 120 volts AC. Assume, for illustrative purposes, that it is desirable to apply a test voltage of 132 kilovolts (kV) to polymer insulator 104, which is designed for operation at 132 kV. The power supply transformer 312 converts the received voltage to a voltage that very closely equals 132 kV.

The actual output voltage on connection 206 is detected such that the processing system 302 accurately determines any differences between the actual applied voltage on connection 206 and the desired test voltage of 132 kV. Processor 316, executing test logic 320, determines an error corresponding to the difference between the desired test voltage and the actual voltage on connection 206.

A control signal, corresponding to determined error, is communicated from the processing system 302 to the power supply controller 310. Power supply controller 310 then causes further regulation of the voltage output onto connection 332. This exemplary feedback control system is understood to iteratively adjust the applied voltage on connection 206 to a value that substantially equals the desired 132 kV. Furthermore, if the voltage provided by power supply 314 fluctuates or changes, voltage on connection 206 can be regulated to maintain the desired value.

In addition to precisely controlling the voltage output on connection 332, the power supply controller 310 limits current on connection 332. Because of the current limiting nature of the power supply controller 310, it is appreciated that safety to test personnel is provided when polymer insulators 104 are tested in the field prior to installation. Since the total available amount of current deliverable from the field test system 200 may be limited to less than a few tens of milli-amps (mA), it is unlikely that the test personnel (presumably in good health), will be significantly injured or killed in the event of an accident.

As noted above, embodiments of the field test system 200 are configured such that the system 200 may be conveniently transported into the field for testing of the polymer insulators prior to installation. In one embodiment, a test criteria 338 is used to determine the likelihood of failure of the polymer insulator 104 if installed and energized in the field. The test is based upon a comparison of the resistive component of the leakage current detected on connection 208 (associated with flow over/through the polymer insulator 104) with the criteria 338. In one embodiment, if the resistive component of the leakage current is less than or equal to the criteria 338, the likelihood of failure is deemed low and the polymer insulator 104 is indicated as being acceptable for installation. However, if the resistive component of the leakage current is greater than the criteria 338, the likelihood of failure is deemed high and the polymer insulator 104 is indicated as being unacceptable for installation. That is, the field test system 200 indicates to the test personnel that the polymer insulator 104 should not be installed since it is likely to fail when energized by the electric transmission system.

To perform the field test, the polymer insulator 104 is positioned in a suitable support device (not shown) that is configured such that the corona rings 204 and/or 210 may be oriented about the ends of the polymer insulator 104, as illustrated in FIG. 2. Connection 206 is then coupled to the high voltage lead 110 and connection 208 is coupled to the ground lead 106. If not already connected, connection 206 is coupled to the corona ring 204 and connection 208 is coupled to the corona ring 210 (if used).

To conduct the testing of polymer insulator 104, the test personnel specifies a voltage to be applied to connection 206. For example, if the polymer insulator 104 is rated for a nominal voltage or 132 kV, the test personnel may specify a test voltage of 132 kV. Or, the test personnel may specify another suitable applied voltage for testing of the polymer insulator 104. In an alternative embodiment, the test personnel may specify the designed operating voltage of the polymer insulator 104 or another suitable identifier, such as a model number or the like. A data table or the like is used to determine a test voltage based upon the specified identifier.

It is understood that any suitable testing protocol may be devised for testing of polymer insulators 104. A single test may be performed, or a plurality of tests may be performed. If a plurality of tests are performed, different applied voltages appropriate for testing that particular polymer insulator 104 may be specified. Or, the field conditions may be altered between tests. For example, one test may be performed when the polymer insulator 104 is dry, and another test may be performed after application of a liquid to the surface of the polymer insulator 104, such as water or the like.

In one embodiment, the detected current (on connection 208) is analyzed and then compared to the criteria 338. If the resistive component of the detected current is less than or equal to the criteria 338, the field test system 200 indicates a "pass" condition. If the resistive component of the detected current is greater than the criteria 338, the field test system 200 indicates a "fail" condition. The pass/fail condition may be graphically displayed on a display 322 with suitable text and/or coloring. Or, another indicator may be used. For example, audible tones may be used to indicate pass/fail conditions. Or, special light emitting devices may be used to indicate pass/fail conditions. In other embodiments, numerical results are presented to the test personnel.

In one embodiment, the criteria 338 is specified to be one (1.0) microamp. This value is based upon empirical test results of various embodiments that have been reduced to practice. However, other values of criteria 338 may be selected. In one embodiment, the value of criteria 338 is selectable or specifiable by the test personnel. It is noted that based upon empirical test results, the criteria 338 is applicable for various field conditions, such as if the insulator 104 is wet or dry. Thus, a single criteria 338 can be used for all test conditions and/or for all types of polymer insulators 104. However, in other embodiments, different criteria 338 may be specified for different test conditions and/or for different polymer insulators 104.

In a preferred embodiment for testing of a polymer insulator 104, the two corona rings 204 and 210 are employed by the field test system 200. In an alternative embodiment, the low voltage corona ring 210 may be omitted. However, test results may be less reliable and have less repeatability. Using both corona rings 204 and 210 allows accurate, consistent and repeatable testing of all types of polymer insulators 104.

Figure 4:
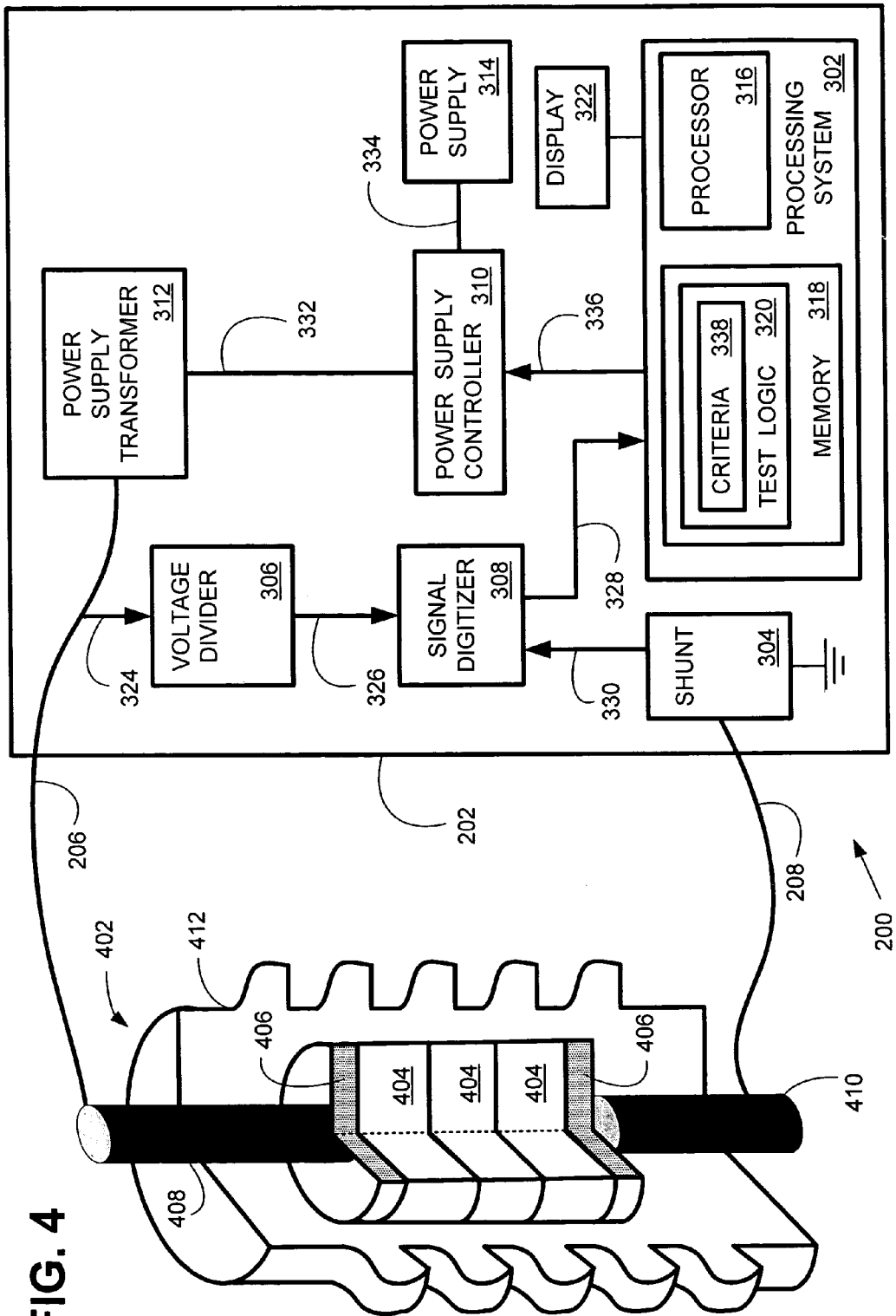
FIG. 4 is a block diagram of an embodiment of the field test system coupled to a metal oxide varistor (MOV) arrester.

FIG. 4 is a block diagram of an embodiment of the field test system 200 coupled to a metal oxide varistor (MOV) arrester 402 (illustrated using a cut-away view to illustrate selected internal components). The components of the field test system 200 embodiment illustrated in FIG. 4 may be substantially similar to the above-described components of FIG. 3. Accordingly, such components are not again described.

In one embodiment of the field test system 200, the components illustrated in FIGS. 3–4 are identical such that field tests on both polymer insulators and MOV arresters can be performed with the same field test system 200. However, as described in greater detail hereinbelow, the test logic 320 will be configured to apply voltages to, and to analyze test data from, the MOV arrester 402. For example, the test logic 320 is configured to cause the power supply controller 310 to automatically adjust the regulated voltage, and hence the voltage on connection 206, in an incremental, step-wise manner when testing MOV arresters. That is, applied voltages are changed (sequentially increased or decreased) by a predefined incremental amount in step-wise manner.

Figure 1:
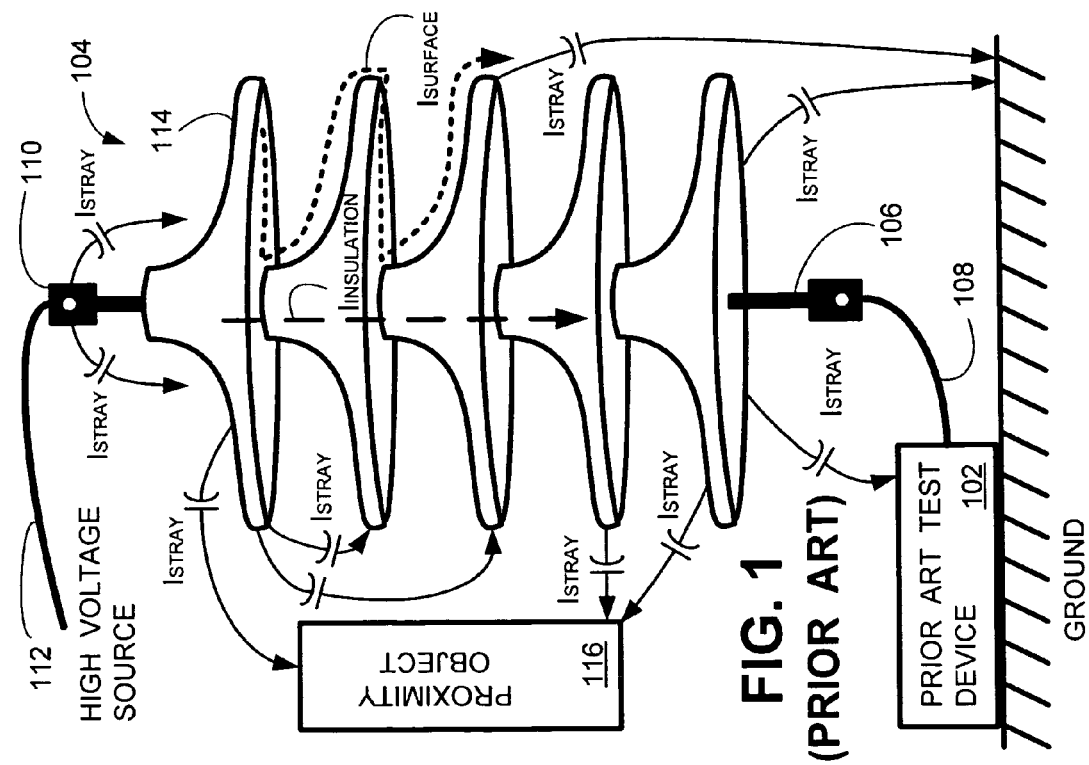
FIG. 1 is a block diagram of an embodiment of a prior art test system.

Internal components of the MOV arrester 402 include one or more MOV disks 404 and electrodes 406. Electrodes 406 ensure a low resistive contact from the MOV disks 404 to the high voltage lead 408 and to the ground lead 410. These components are encased in an enclosure 412 that may function much like the above described polymer insulators 104 (FIGS. 1–3). It is understood that not all internal components of the MOV arrester 402 are illustrated in FIG. 4.

Figure 5A:
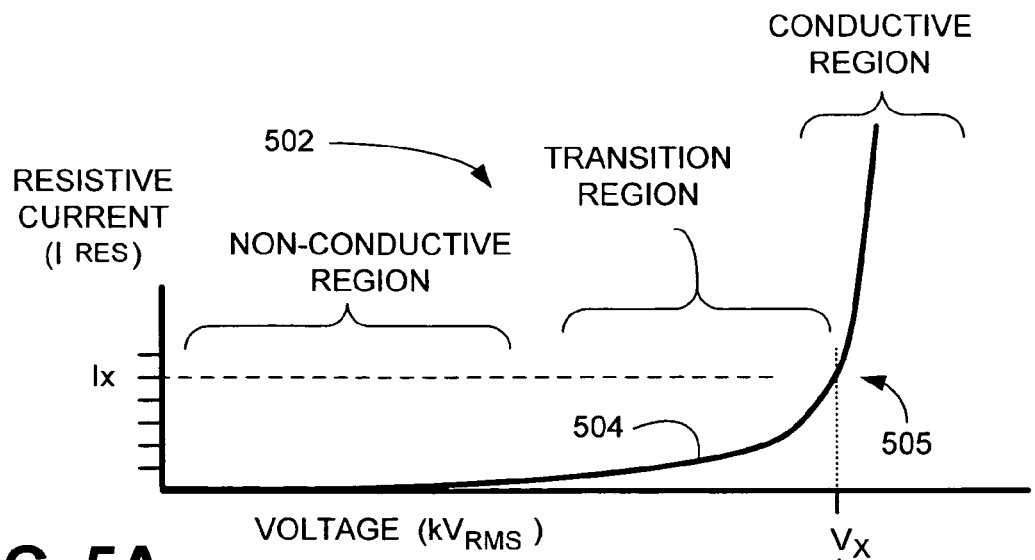
FIGS. 5A and 5B illustrate electrical properties of a MOV arrester.
Figure 5B:
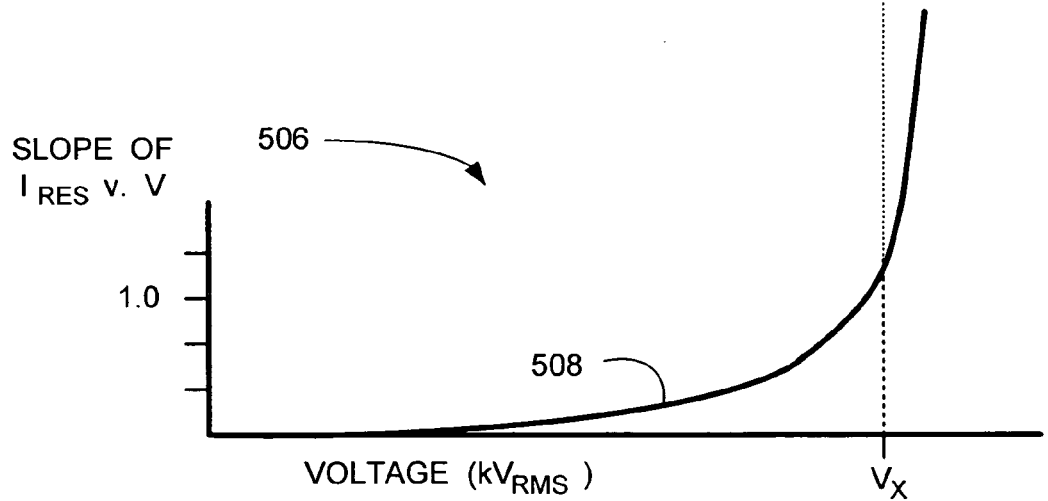

FIGS. 5A and 5B generally illustrate electrical properties of a MOV arrester 402 (FIG. 4). MOV disks 404 are well-known, highly nonlinear metal oxide varistors configured to have a relatively high impedance at applied voltages less than a designed break-down voltage. MOV disks 404 are further configured to have a relatively low impedance at applied voltages greater than the designed break-down voltage.

FIG. 5A is a simplified generic plot 502 of a resistive current ($I_{RES}$) versus the applied voltage [in kilo-volts, root-mean-square ($kV_{RMS}$)] curve 504 exhibited by a hypothetical MOV disk 404. FIG. 5B is a simplified plot 506 of a slope curve 508. The plotted slope curve 506 corresponds to the slope at points on curve 502.

MOV disks 404 are non-conductive when the applied voltage is less than the designed break-down voltage. For example, at applied voltages equal to the operating voltage of the electric transmission system to which they are coupled to, resistive current is negligible. That is, a relatively large change in applied voltage over the non-conductive region results in a relatively small change in measurable resistive current. This non-conductive region is illustrated in FIG. 5A, where $I_{RES}$ is substantially zero.

The MOV disks 404 are conductive when the applied voltage is greater than the designed break-down voltage. For example, during a relatively high voltage surge caused by a lightning strike or a system disturbance, the resistive current is very high. Accordingly, when applied voltages are in the conductive region, a relatively small change in applied voltage results in a relatively large change in resistive current. This conductive region is illustrated in FIG. 5A.

When voltage applied to the MOV arrester 402 transitions from the non-conductive voltage region to the conductive region (denoted as the transition region in FIG. 5A), resistive current begins to more rapidly increase as voltage increases. This portion of curve 504 exhibiting a rapidly increasing current may be referred to as the "knee" of the $I_{RES}$ v. voltage curve 504.

Of particular interest are regions of curve 504 where a relatively small change in applied voltage results in a relatively large change in resistive current which is measurable or discernable. The location of this transition is referred to hereinafter as the point of conduction 505. The voltage at this point 505 is referred to hereinafter as the conduction voltage (Vx). The current at this point 505 is referred to hereinafter as the conduction current (Ix). The point of conduction 505 can be accurately and reliably identified by determining the slope of the curve 504. That is, the point of conduction 505 may be identified by determining a change in the resistive component of the measured current per the change in the applied voltage (slope), and then comparing the determined slope with a predefined value that corresponds to the slope at the point of conduction 505. The corresponding slope of curve 504 at Vx (and/or Ix) is easily discernable on FIG. 5B.

Figure 6A:
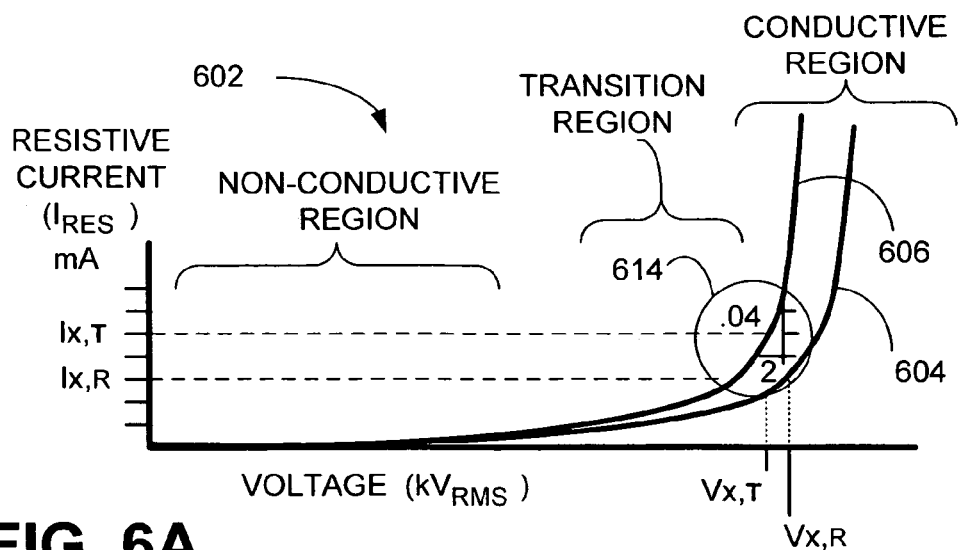
FIGS. 6A–6C illustrate electrical properties of reference MOV arrester and a tested MOV arrester.
Figure 6B:
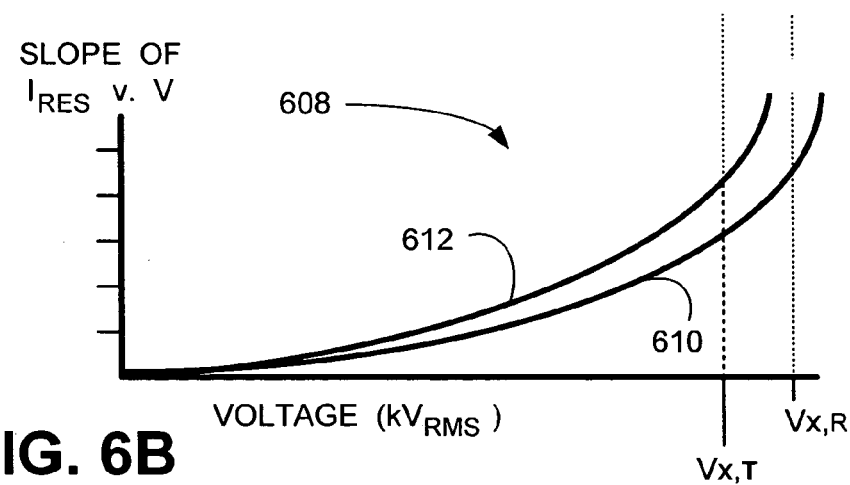
Figure 6C:
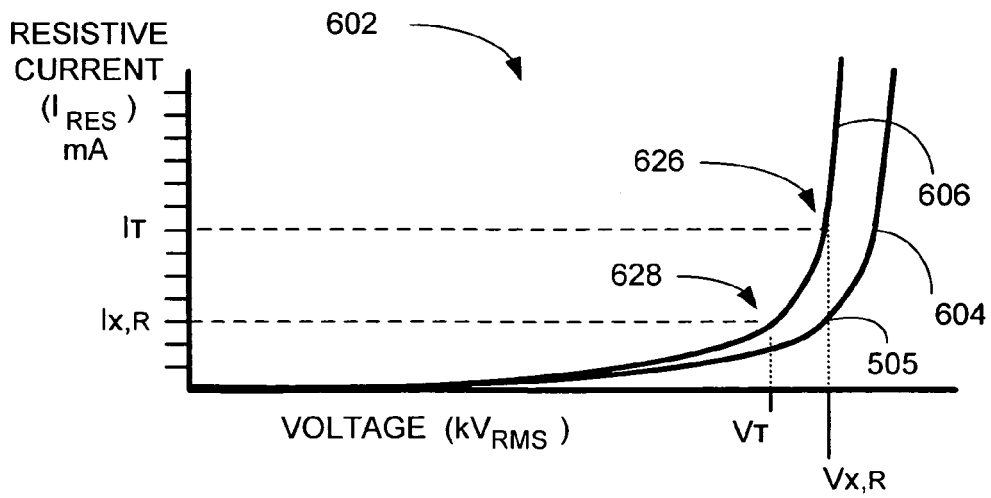

FIGS. 6A–6C generally illustrate electrical properties of a reference MOV arrester compared with a tested MOV arrester 402 (FIG. 4). Plot 602 illustrates two curves 604 and 606 corresponding to resistive current ($I_{RES}$) versus applied voltage ($kV_{RMS}$). The reference curve 604 corresponds to a properly functioning pre-tested MOV arrester. The reference MOV arrester is known to exhibit electrical characteristics in accordance with the design parameters of the MOV arrester. That is, the reference curve 604 illustrates the characteristics of a properly functioning MOV arrester. The curve 606 corresponds to test data from a hypothetical tested MOV arrester 402.

Slopes may be more easily discernable in some situations, illustrated on FIG. 6B, since the vertical axis of plot 608 corresponds to the determined slope of curves 604 and 606. Slope curves 610 and 612 plot the slope of curves 604 and 606, respectively.

Testing of MOV arresters is based upon applying a series of incrementally increasing voltages (or decreasing voltages) to the MOV arrester 402 under test. Voltages are applied on the high voltage lead 408 via connection 206 (FIG. 4). For each applied voltage, a current, having resistive and capacitive components, is detected on connection 208. The corresponding resistive current is then calculated by logic 320. In one embodiment, the total amount of leakage current is detected.

Information corresponding to the test voltage and the detected leakage current are both required to determine the resistive component of current in the processing system 302. One embodiment uses the digitized test voltage signal and the digitized leakage current signal.

In one embodiment, for each incremental change in applied voltage, the corresponding resistive current components are compared to determine a change in resistive current for that voltage increment. Then, the change in resistive current is divided by the incremental voltage change to determine slope at that point. As the test progresses over a series of incrementally applied voltages, the determined slope at each of the test points approximates the slope curve 606.

In another embodiment, voltages are increased on the tested MOV arrester 402 up to at least the conduction voltage (Vx,r) of the reference MOV arrester. In yet another embodiment, voltages are increased on the tested MOV arrester 402 up to at least the conduction current (Ix,r) of the reference MOV arrester. In these embodiments, at least the determined resistive current for each voltage increment is saved. The above-described associated slopes for each test point do not need to be necessarily calculated with these embodiments. In one embodiment, voltages may be increased in either a continuous manner with current readings sampled at known applied voltages. Such an embodiment applies voltages in a continuous manner and concurrently samples current through the MOV arrester and the test voltage Because of the above-described configuration of embodiments of the field test system 200 (FIG. 4), the applied voltages are known and controllable with a high degree of accuracy since the power supply controller 310 is providing a plurality of regulated voltages that are changed in an incremental, step-wise manner. Accordingly, the processing system 302 compares the digital signal corresponding to the detected applied voltage to an incremental regulated voltage selected for testing the MOV arrester 402, and the processing system 302 generates (and communicates) a control signal to the power supply controller 310 such that the detected applied voltage substantially equals the selected incremental regulated voltage (at least within a predefined threshold).

Data corresponding to the reference MOV arrester is pre-stored in memory 318 (FIG. 4). For example, the reference test data itself, the value of the conduction voltage (Vx,r) and/or conduction current (Ix,r) of the reverence MOV arrester, and/or other suitable data corresponding to curves 604 and/or 610, may be stored in memory 318, depending upon the embodiment. Similarly, as data is collected during the testing of the MOV arrester 402 under test, the data is saved into memory 318. (In some embodiments, the reference data and the test data may reside on different medium. For example, reference data might be downloaded from a medium provided by the manufacturer or vendor of the MOV arrester.)

The pre-stored reference data corresponding to the point of conduction of the reference MOV arrester is used to determine the scope of testing of MOV arrester 402. Depending upon the embodiment, testing starts at some predetermined initial voltage and continues until the applied voltage is increased up at least to the conduction voltage (Vx,r) of the reverence MOV arrester, at least to the conduction current (Ix,r) of the reverence MOV arrester, or at least until the conduction point of the MOV arrester 402 under test is determined. That is, the applied voltages are increased up to a final test voltage value that corresponds to the conduction point of the reference MOV arrester.

Generally, if the tested MOV arrester 402 indicates a point of conduction (conduction voltage, Vx,t and/or conduction current, Ix,t) that is significantly different than the reference point of conduction (conduction voltage, Vx,r and/or conduction current, Ix,r) of the reference MOV arrester, the tested MOV arrester 402 is deemed as unsuitable for use. That is, the tested MOV arrester 402 is deemed to have "failed" the test. That is, the tested MOV arrester is deemed to have failed the test if the test data of the tested MOV arrester 402 does not correspond to data associated with the reference point of conduction of the reference MOV arrester.

However, if the tested MOV arrester 402 indicates a point of conduction (conduction voltage, Vx,t and/or conduction current, Ix,t) that is relatively similar the reference point of conduction (conduction voltage, Vx,r and/or conduction current, Ix,r) of the reference MOV arrester (within some predetermined amount), the tested arrester is deemed as suitable for use. That is, the tested MOV arrester 402 is deemed to have "passed" the test. For example, the tested voltage (Vt) may be slightly less than the reference conduction voltage (Vx,r), but since the difference between the tested voltage (Vt) and reference conduction voltages (Vx,r) is less than the predetermined amount, the tested MOV arrester 402 is deemed to have "passed" the test. In another situation, the tested current (It) may be slightly greater than the reference conduction current (Ix,t), but since the difference between the tested current (It) and reference conduction current (Ix,r) is less than the predetermined amount, the tested MOV arrester 402 is deemed to have "passed" the test. That is, the tested MOV arrester is deemed to have passed the test if the test data of the tested MOV arrester 402 corresponds to data associated with the reference point of conduction of the reference MOV arrester.

FIG. 6C illustrates a comparison of test data (represented by curve 606) of a MOV arrester that exhibits a failed condition with data of a pre-tested, reference MOV arrester (represented by curve 604). FIG. 6c is substantially similar to the above-described FIG. 6A.

In an embodiment where the applied test voltages are increased up to a value that corresponds to the reference MOV arrester conduction voltage (Vx,r), the corresponding test current (It) is seen to be significantly greater than the reference conduction current (Ix,r). Since this difference is significant, the test system 200 determines a "fail" condition for the tested MOV arrester 402 (FIG. 4). That is, the difference between the test current (It) and some predefined current corresponding to the reference conduction current (Ix,r) may be calculated. This predefined current may be (Ix,r), or may be (Ix,r) adjusted by some selected amount of margin. If the calculated difference is greater than the reference conduction current (Ix,r), a predefined threshold, margin or the like, the test system 200 determines a "fail" condition. Alternatively, if the calculated difference is within the reference conduction current (Ix,r), the predefined threshold, margin or the like, the test system 200 determines a "passed" condition. Accordingly, the MOV arrester has passed the test when (Vt) is greater than or equal to a predefined voltage corresponding to (Vx,r), and such that the MOV arrester has failed the test when (Vt) is less than the predefined voltage In an embodiment where the applied test voltages are increased up to a value that corresponds to the reference MOV arrester conduction current (Ix,r), the corresponding test voltage (Vt) is seen to be significantly less than the reference conduction voltage (Vx,r). Since this difference is significant, the test system 200 determines a "fail" condition for the tested MOV arrester 402 (FIG. 4). That is, the difference between the test voltage (Vt) and a predefined voltage corresponding to (Vx,r) may be calculated. This predefined voltage may be (Vx,r), or may be (Vx,r) adjusted by some selected amount of margin. If the calculated difference is greater than the reference conduction voltage (Vx,r), a predefined threshold, margin or the like, the test system 200 determines a "fail" condition. Alternatively, if the calculated difference is within the reference conduction voltage (Vx,r), the predefined threshold, margin or the like, the test system 200 determines a "passed" condition.

In an embodiment where the applied test voltages are increased up to the point of conduction of the tested MOV arrester 402, the corresponding test current will be greater than the reference conduction current (Ix,r). Also, the corresponding test voltage will be less than the reference conduction voltage (Vx,r). Since these differences are determinable, the test system 200 determines a "fail" condition for the tested MOV arrester 402 (FIG. 4). That is, the difference between the corresponding test information (current and/or the reference conduction current) of the tested MOV arrester 402 (when the tested current is greater, or when the tested voltage is lower) than the reference point of conduction information (Ix,r or Vx,r), a predefined threshold, margin or the like, the test system 200 determines a "fail" condition. Alternatively, if the calculated difference is within the reference point of conduction information (Ix,r or Vx,r), the predefined threshold, margin or the like, the test system 200 determines a "passed" condition.

Any suitable margin may be selected based upon the practices of the user performing the test. Thus, one embodiment provides for the optional specification of this amount of margin by the user. In other embodiments, the margin can be preset into the database for the reference MOV test data.

In other embodiments, other current/voltage response characteristics of the test and reference data may be selected for comparison. For example, another current/voltage point associated with the transition region may be selected. In another embodiment, other relevant slope points of the reference curve 604 and test curves 606 may be determined and compared (see slope curves 610 and 612, respectively, of FIG. 6B). For example, since current is being detected, one embodiment determines a conduction current that corresponds to the conduction voltage.

Several points are made regarding curves 604 and 606, and/or their associated slope curves 610 and 612, respectively. First, if the curves 604 and 606 are very close together, the curves may be difficult for the test personnel to visually discern differences between the point of conduction of the tested MOV arrester and the reference point of conduction when the curves are displayed on display 322 (FIG. 4). For example, the displayed curves may not have sufficient resolution along the voltage axis for viewing by the test personnel.

Accordingly, various embodiments mathematically determine and compare the points of conduction of a tested MOV arrester and the reference MOV arrester (less the predefined amount of margin). Results of the testing and comparison may then be presented on display 322. In some embodiments, only an indication of pass/fail test results is displayed on display 322 using suitable text and/or coloring. Or, another indicator may be used. For example, audible tones may be used to indicate pass/fail conditions. Or, special light emitting devices may be used to indicate pass/fail conditions. In other embodiments, numerical results are presented to the test personnel.

Second, actual display of the curves 604 and/or 606 (or slope curves 610 and 612) displayed on display 322 (FIG. 4) is not required for the test personnel to understand test results if the test results are presented in a pass/fail format. The above-described indicators of pass/fail conditions may be sufficient to indicate suitability of the tested MOV arrester 402 to be installed in the field. Accordingly, a very simple, reliable and easy-to-use field test system 200 may be made.

In one exemplary embodiment, applied voltages are incremented by 2 kV. This increment in applied voltage is sufficiently large such that the incremental voltages can be applied in a reasonable period of time. The 2 kV voltage increment, when in the general area corresponding to the point of conduction of the MOV arrester, allows detection of a discernable and significant amount of leakage current by the test equipment.

Other suitable voltage increments may be used for testing MOV arresters so long as the point of conduction of the tested MOV arrester can be reliably and accurately determined. However, care must be taken so that the selected voltage increment amount is not too large or not too small. For example, a much larger voltage increment may provide a more detectable change in leakage current. However, when using a very large voltage increment, sufficient resolution may not be provided to accurately identify the point of conduction. On the other hand, a very small voltage increment may provide for a determination of a very accurate point of conduction. However, with a very small voltage increment, the changes in leakage current may be so small that the detected changes may not be accurate or reliable.

As noted above, when the applied voltages are in the transition region and/or the conductive regions of the MOV arrester 402 (FIG. 4), the changes in the detected current on connection 208 are discernable with sufficient resolution that meaningful and accurate changes in the resistive current component of the detected leakage current can be determined. Other suitable increments of applied voltage may be used by other embodiments so long as sufficient resolution of current changes in the region of the conduction voltages Vx,t (FIGS. 6A–B), or other current/voltage response criteria, can be detected.

The above-described configuration of the components of the exemplary field test system 200 embodiment allows the automatic application and precise regulation of applied voltage increments. The changes in the resistive current component are computationally determined for the voltage increments based upon measured leakage current at each voltage increment. The processing system determines the point of conduction of the tested MOV arrester and compares the determined point of conduction with the point of conduction of a reference MOV arrester. Test results are presented in a pass/fail format. Thus, no actions are required on the part of the test personnel to test the MOV arrester 402.

In the above-described embodiments where the applied voltages are incremented by 2 kV, the conduction voltage Vx,t (FIGS. 6A–B) of the tested MOV arrester 402 (FIG. 4) is defined to be the point on curve 606 or 612 (FIGS. 6A–B) where the determined rate of change in the resistive component of the detected leakage current for a 2 kV voltage change corresponds (substantially equals) to 0.04 milli-amps (mA). This point is indicated by the encircled region 614 on curve 606.

Furthermore, based upon actual test results, the determined 0.04 mA rate of change in resistive current corresponding to a 2 kV change in the applied voltage consistently corresponded to the point of conduction for a variety of tested MOV arresters from different manufacturers and for different designed operating voltages. Thus, the same test and comparison criteria may be used to normalize the test for a great variety of MOV arresters.

Since there are a variety of MOV arresters used by the industry, a database of reference data (curves, points of conduction, Vx,r and/or Ix,r values, which correspond to the above-described criteria 338) for many different MOV arresters may be stored in memory 318 (FIG. 4) or in another suitable medium. MOV arrester types may be identified with any suitable identifier, which is correlated to the reference data. For example, but not limited to, the identifier may be an operating voltage, model number or the like. Furthermore, the database may be easily updated to accommodate new models and/or changes in technology. Accordingly, during testing, the test personnel need only specify the identifier of the reference MOV arrester that corresponds to the MOV arrester 402 that is to be tested.

As noted above, the criteria 338 corresponds to the reference point of conduction. One exemplary point of conduction was identified. The point of conduction used in any particular embodiment of field test system 200 may be selected, so long as the point of conduction is readily identifiable with an acceptable degree of accuracy, reliability and repeatability for the MOV arrester under test. In other embodiments, margin may be subtracted from the reference point of conduction (or added to the determined point of conduction). That is, if the determined point of conduction for the tested MOV arrester 402 is sufficiently close to the reference point of conduction (within the predefined margin), the MOV arrester 402 passes testing.

To perform the field test, the MOV arrester 402 is positioned in a suitable support device (not shown). Connection 206 is coupled to the high voltage lead 408 and connection 208 is coupled to the ground lead 410 (FIG. 4).

Prior to testing the MOV arrester 402, the test personnel specifies the type of MOV arrester (corresponding to a tested reference MOV arrester) that is to be tested. Accordingly, the test logic 320 retrieves the appropriate reference voltage (Vx,r) or other reference data so that a comparison may be made with the test data from the MOV arrester 402.

Next, precisely known voltages are incrementally applied onto connection 206 in a step-wise fashion. In one embodiment, the applied initial applied voltage starts at zero volts, and is increased in predefined and known increments up to a final applied voltage such that the above-described conduction voltage Vx,t, (or other selected current/voltage criteria) is determined.

In another embodiment, the first applied voltage may be a predetermined voltage or selectable by the test personnel. For example, the initial applied voltage might start at 50% of the operating voltage of the MOV arrester 402, thereby avoiding the collection of unnecessary data and accordingly, reduce the testing time. In another embodiment, applied voltages are decreased in a step-wise fashion, starting at some predetermined initial applied voltage.

As noted above, applied incremental voltages must be precisely known, and the actual applied voltage must accurately correspond to the intended incremental voltage. To apply the incremental voltages onto connection 206 in a step-wise fashion, a control signal is communicated from processing system 302, via connection 336, to the power supply controller 310. The control signal specifies the incremental voltage that is to be applied onto connection 206, referred to as the "intended incremental voltage." For example, if the intended incremental voltages are incremented in 2 kV steps, then the actual applied voltage must be incremented in 2 kV steps and must correspond precisely with the value of the intended incremental voltage at each increment. As noted above, any suitable voltage increment may be used for testing MOV arresters so long as sufficient resolution of the test data is provided such that the conduction voltage Vx,t, (or other selected current/voltage criteria) can be identified.

The above-described feedback system allows precise control of applied voltages for each increment of the test.

Voltage divider 306 allows detection of the applied voltage on connection 206 such that an error between the actual applied voltage and the intended incremental voltage may be determined by processing system 302 (FIG. 4). If the actual applied voltage does not equal the intended incremental voltage (by some predefined error threshold, typically a very small value), the processing system 302 generates and communicates another control signal to the power supply controller 310 specifying an adjustment to the applied voltage. This adjustment process continues until the actual applied voltage equals the intended incremental voltage (by at least the predefined error threshold). Then, current is detected on connection 208 and the corresponding results saved into memory 318.

As the test proceeds, applied voltages are adjusted incrementally in a step-wise fashion. For each applied incremental voltage, current is detected on connection 208 (FIG. 4), as described above. The current data for each incremental voltage is digitized and communicated to the processing system 302. Incremental changes in voltages should be sufficiently small such that the current data associated with curve 606 (FIG. 6) is determinable. However, incremental voltages changes should not be so large that the current data is meaningless. That is, as voltages are incrementally increased through the transition region into the conduction region, the location Vx,t corresponding to the conduction current should be identifiable.

Once the resistive component of the current is determined for the voltage increment, the resistive component is compared with the determined resistive component of the previous voltage increment. This difference is used to determine the rate of change in the resistive current component, and corresponds to the slope of the slope curves 604 and 606 (FIG. 6).

Upon completion of the test for the current increment, the applied voltage is then adjusted to the next incremental value. The applied voltage is precisely adjusted to equal the next intended incremental voltage, and the current then is detected on connection 208. The process is continued until the conduction voltage Vx,t, (or other selected current/ voltage criteria) is determined. Accordingly, the test is then completed.

In one embodiment, applied voltages are incrementally increased up to a voltage that corresponds to the conduction voltage of the reference MOV arrester. (In another embodiment, the applied voltage may be increased to a greater amount.) Then, the value of the conduction voltage (and/or the conduction current) for the tested MOV arrester is compared with the value of the conduction voltage (and/or the conduction current) of the MOV arrester. If the value of the conduction voltage (and/or the conduction current) for the tested MOV arrester is equal to or greater than the conduction voltage (and/or the conduction current) of the MOV arrester, the tested MOV arrester has passed and is suitable of installation in the field. (In practice, an amount of margin is subtracted from the known conduction voltage and/or current of the MOV arrester. Thus, if the conduction voltage and/or current for the tested MOV arrester is greater than or equal to this reference conduction voltage or current, less the margin value, the tested MOV arrester passes testing.)

In another embodiment, applied voltages are incrementally increased up to a point where the measured leakage current (or the determined resistive current component) corresponds to the conduction current of the reference MOV arrester. (In another embodiment, the applied voltage may be increased further so that the measured leakage current, or the determined resistive current component, is greater than the reference conduction current.) Then, the value of the conduction voltage (and/or the conduction current) for the tested MOV arrester is compared with the value of the conduction voltage (and/or the conduction current) of the MOV arrester as described above.

In yet another embodiment, applied voltages are incrementally increased up to a point where the determined slope corresponds to the slope corresponding to the point of conduction of the reference MOV arrester. (In another embodiment, the applied voltage may be increased further so that the determined slope is greater than the slope corresponding to the reference point of conduction.) Then, the value of the conduction voltage (and/or the conduction current) for the tested MOV arrester is compared with the value of the conduction voltage (and/or the conduction current) of the MOV arrester as described above.

The above-described components illustrated in FIGS. 2–4, and their associated connections, may be designed to be partial discharge (PD) free. PD free grade components and connections are used so that PD can be detected in the insulator or arrester under test as an additional test parameter. For example, the presence of PD in the insulator or arrester under test is a condition of specimen failure, since it is known that PD can degrade the electrical characteristics of these devices. It follows that the test power supply and all connections must be PD free for the range of test voltages used.

One embodiment for PD detection is configured to monitor the detected current on connection 208 to identify any random occurrences of partial discharge (PD). The test logic 320 analyzes the measured current waveform for significant deviations from one digitized point to the next in the frequency cycle (for example, 60 Hz). In one exemplary embodiment, the predefined deviation value is 20% of the true rms current value of the total current, although any suitable value could be used. Significant deviations greater that the predefined deviation value indicates a possible PD occurrence. If at least one occurrence of PD is detected, the test results for the insulator or arrester is a fail condition.

In some embodiments, the test logic 320 is further configured to remove the effects of the harmonic currents, which can interfere with PD detection by shunt 304 (FIGS. 3–4). The harmonic components are detected by a comparison of the same digitized points from cycle-to-cycle. If these same or repetitive cycle-to-cycle digitized points exceed the predefined deviation, these points are not identified as PD. This algorithm may lower the overall PD count, but the PD detection is only to determine the presence of PD, not to place a calibrated level on the detection method. The PD detection is used to verify any shielding or voltage stand-off irregularities at operating voltage in otherwise good insulation. In this manner, the PD counts due to normal harmonic leakage currents are removed from the PD detection of the polymer insulator 104 (FIGS. 2–3) or the MOV arrester 402 (FIG. 4) and the deviation counts due to PD only are recorded for pass or fail determination.

As noted above, some embodiments of the field test system 200 may be configured to test both polymer insulators 104 (FIGS. 2–3) and MOV arresters 402 (FIG. 4). Such embodiments would have a switch or other selectable device (such as a menu shown on the display 322 to enable the selection) so that the test personnel can indicate to the field test system 200 what type of device is to be tested. For example, if the processor system 302 is a laptop or notebook type system, selection can be provided via a menu and the user interface system (keyboard and /or pointer device). In other embodiments, a physical switch may be used to select between polymer insulator and MOV arrester testing.

Figure 7:
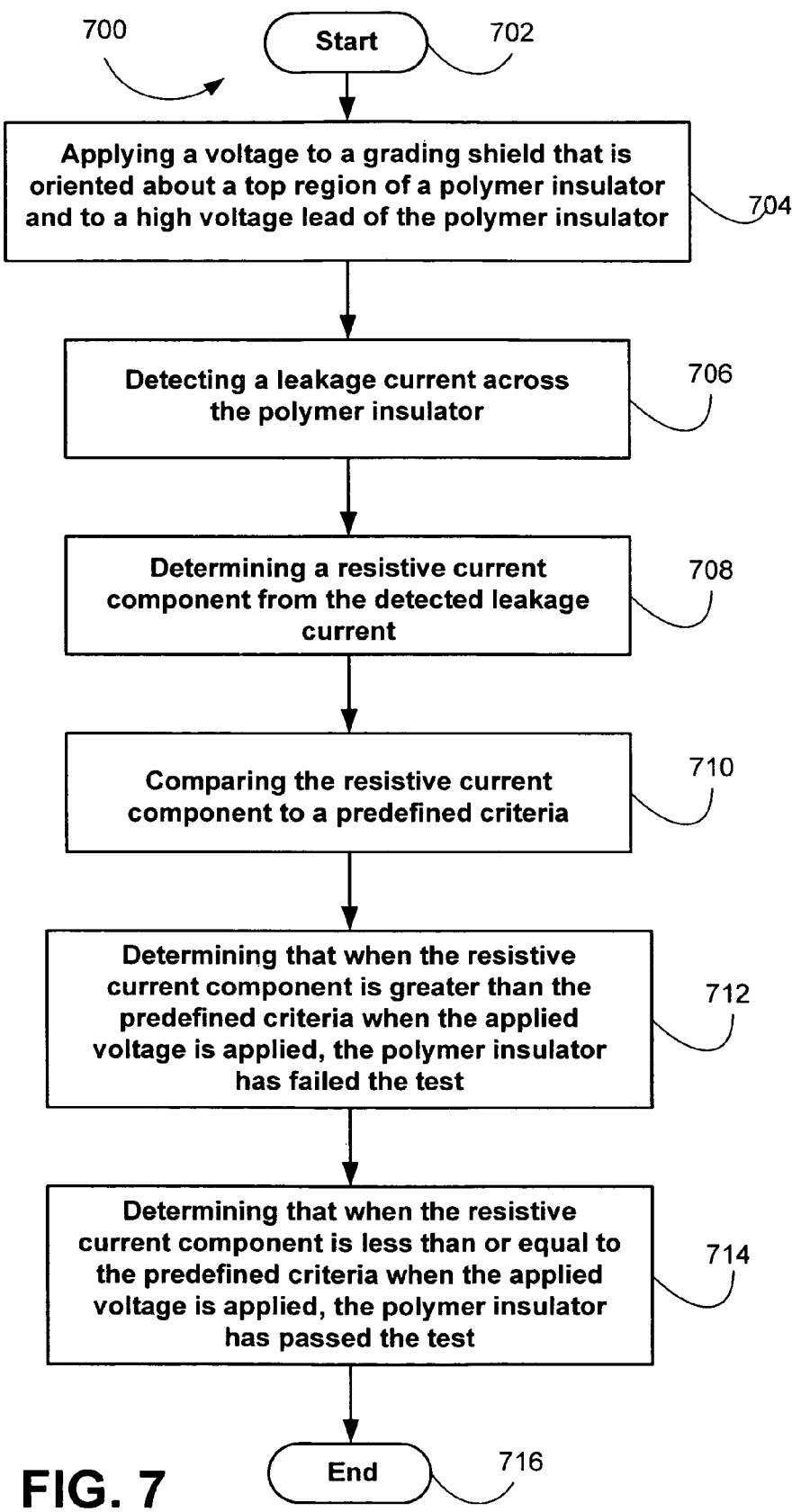
FIG. 7 is a flowchart illustrating a process used by an embodiment of the field test system to test a polymer insulator.
Figure 8:
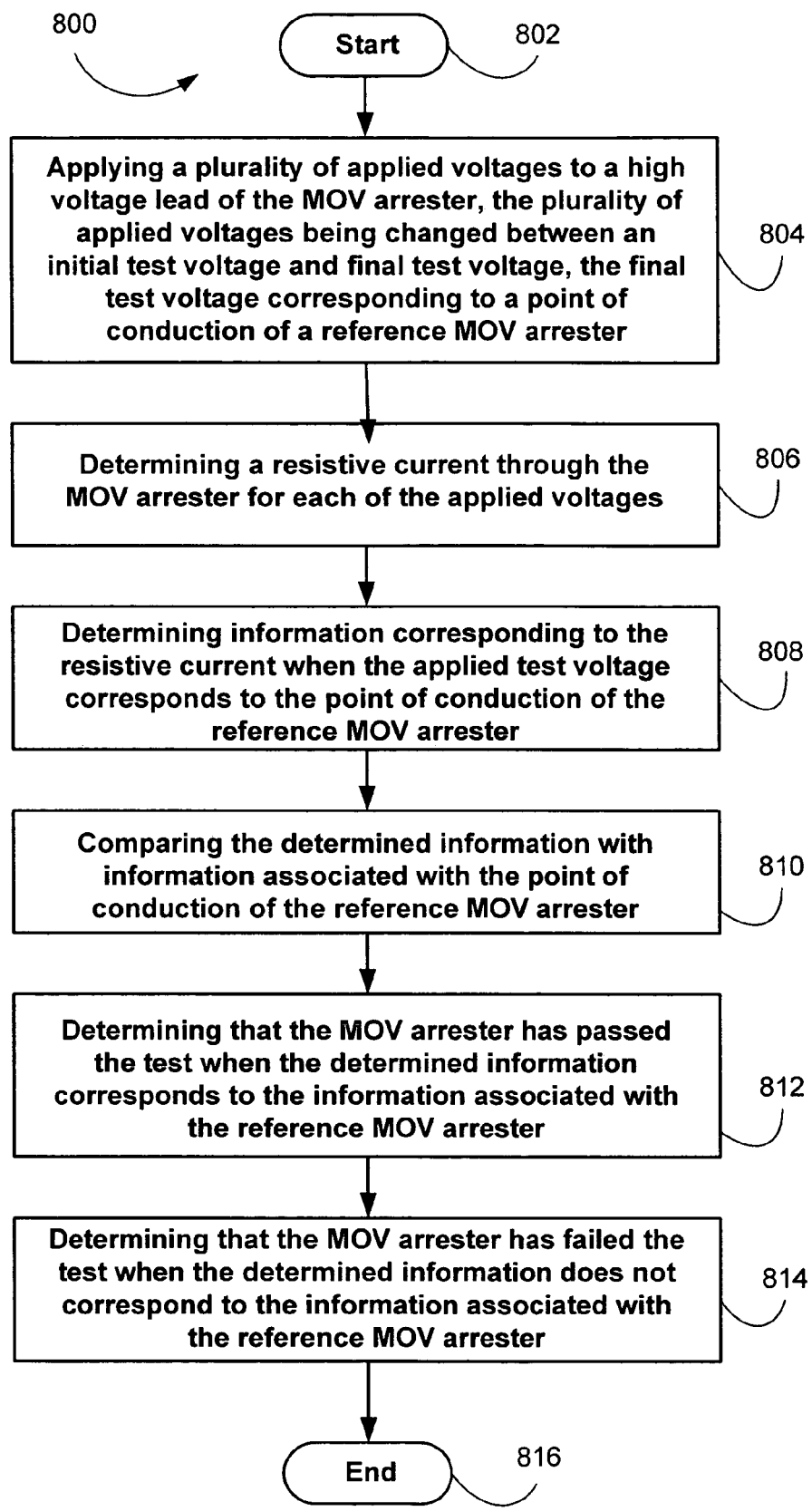
FIG. 8 is a flowchart illustrating a process used by an embodiment of the field test system to test a MOV arrester.

Processes used by one exemplary embodiment for performing the above-described testing of polymer insulators and MOV arresters are described in detail. FIG. 7 is a flowchart 700 illustrating a process used by an embodiment of the field test system 200 (FIGS. 1–4) to test a polymer insulator 104 (FIGS. 1–3). FIG. 8 is a flowchart 800 illustrating a process used by an embodiment of the field test system 200 to test a MOV arrester 402 (FIG. 3–4). Flow chart 700 of FIG. 7 and flow chart 800 of FIG. 8 show the architecture, functionality, and operation of an embodiment for implementing the test logic 320 (FIGS. 3–4). An alternative embodiment implements the logic of flow charts 700 and/or 800 with hardware configured as a state machine. In this regard, each block may represent a module, segment or portion of code, which comprises one or more executable instructions for implementing the specified logical function(s). It should also be noted that in alternative embodiments, the functions noted in the blocks may occur out of the order noted in FIGS. 7 and/or 8, or may include additional functions. For example, two blocks shown in succession in FIGS. 7 and/or 8 may in fact be substantially executed concurrently, the blocks may sometimes be executed in the reverse order, or some of the blocks may not be executed in all instances, depending upon the functionality involved, as will be further clarified hereinbelow. All such modifications and variations are intended to be included herein within the scope of this disclosure.

The process of testing a polymer insulator begins at block 702. At block 704, a voltage is applied to a grading shield that is oriented about a top region of a polymer insulator and to a high voltage lead of the polymer insulator. At block 706, a leakage current across the polymer insulator is detected. At block 708, a resistive current component is determined from the detected leakage current. At block 710, the resistive current component is compared to a predefined criteria. At block 712, when the resistive current component is above a predefined criteria when the applied voltage is applied, the polymer insulator is determined to have failed the test. At block 714, when the resistive current component is less than or equal to the predefined criteria when the applied voltage is applied, the polymer insulator is determined to have passed the test. The process ends at block 716.

The process of testing a MOV arrester begins at block 802. At block 804, a plurality of applied voltages are applied to a high voltage lead of the MOV arrester, the plurality of applied voltages being changed between an initial test voltage and final test voltage, the final test voltage corresponding to a point of conduction of a reference MOV arrester. At block 806, a resistive current through the MOV arrester for each of the applied voltages is determined. At block 808, information corresponding to the resistive current when the applied test voltage corresponds to the point of conduction of the reference MOV arrester is determined. At block 810, the determined information is compared with information associated with the point of conduction of the reference MOV arrester. At block 812, the MOV arrester is determined to have passed the test when the determined information corresponds to the information associated with the reference MOV arrester. At block 814, the MOV arrester is determined to have failed the test when the determined information does not correspond to the information associated with the reference MOV arrester. The process ends at block 816.

It should be emphasized that the above-described embodiments of the field test system 200 are merely possible examples of implementations of the invention. Many variations and modifications may be made to the above-described embodiments. All such modifications and variations are intended to be included herein within the scope of this disclosure.

Therefore, having thus described the invention, at least the following is claimed:

1. A method for testing metal oxide varistor (MOV) arresters, comprising:
   applying a plurality of applied voltages to a high voltage lead of the MOV arrester, the plurality of applied voltages being changed between an initial test voltage and final test voltage, the final test voltage corresponding to a point of conduction of a reference MOV arrester;
   determining a resistive current through the MOV arrester for each of the applied voltages;
   determining information corresponding to the resistive current when the applied test voltage corresponds to the point of conduction of the reference MOV arrester;
   comparing the determined information with information associated with the point of conduction of the reference MOV arrester;
   determining that the MOV arrester has passed the test when the determined information corresponds to the information associated with the reference MOV arrester; and
   determining that the MOV arrester has failed the test when the determined information does not correspond to the information associated with the reference MOV arrester; and
   indicating whether the MOV arrester has passed or failed the test.

2. The method of claim 1, further comprising:
   detecting the applied voltage across the MOV arrester; and
   determining a resistive current component from the detected leakage current and applied voltage.

3. The method of claim 1, further comprising:
   receiving information corresponding to the applied voltage across the MOV arrester; and
   determining a resistive current component from the detected leakage current and applied voltage information.

4. The method of claim 1, wherein the determined information is a current value (It) determined at the final test voltage value that corresponds to a conduction voltage (Vx,r) of the reference MOV arrester, and wherein the information associated with the reference MOV arrester is a conduction current (Ix,r), such that the MOV arrester has passed the test when (It) is less than or equal to a predefined current corresponding to (Ix,r), and such that the MOV arrester has failed the test when (It) is greater than the predefined current.

5. The method of claim 1, wherein the determined information is a voltage value (Vt) determined at the final test voltage value that corresponds to a conduction current (Ix,r) of the reference MOV arrester, and wherein the information associated with a reference MOV arrester is the conduction voltage (Vx,r), such that the MOV arrester has passed the test when (Vt) is greater than or equal to a predefined voltage corresponding to (Vx,r), and such that the MOV arrester has failed the test when (Vt) is less than the predefined voltage.

6. The method of claim 1, wherein the determined information is a current value (It) determined at the final test voltage value that corresponds to a point of conduction of the MOV arrester, and wherein the information associated with the reference MOV arrester is a conduction current (Ix,r), such that the MOV arrester has passed the test when (It) is less than or equal to a predefined current corresponding to (Ix,r), and such that the MOV arrester has failed the test when (It) is greater than the predefined current.

7. The method of claim 1, wherein the determined information is a voltage value (Vt) determined at the final test voltage value that corresponds to a point of conduction of the MOV arrester, and wherein the information associated with the reference MOV arrester is a conduction voltage (Vx,r), such that the MOV arrester has passed the test when (Vt) is greater than a predefined voltage corresponding to (Vx,r), and such that the MOV arrester has failed the test when (Vt) is less than or equal to the predefined voltage.

8. The method of claim 1, further comprising detecting a current through the MOV arrester for each of the applied voltages.

9. The method of claim 1, further comprising applying voltages in step-wise manner by a predefined incremental amount.

10. The method of claim 1, further comprising applying voltages in a continuous manner and concurrently sampling current through the MOV arrester and the test voltage.

11. The method of claim 1, wherein applying the plurality of applied voltages further comprises increasing the applied voltages by a predefined incremental amount in step-wise manner.

12. The method of claim 11, wherein increasing the plurality of applied voltages further comprises starting with a first voltage of zero volts.

13. The method of claim 11, wherein increasing the plurality of applied voltages further comprises starting with a first voltage equal to a predetermined voltage.

14. The method of claim 11, wherein increasing the plurality of applied voltages further comprises starting with a first voltage equal to a selected voltage.

15. The method of claim 1, further comprising indicating on a display the failing or the passing of the test.

16. The method of claim 1, wherein determining the point of conduction further comprises determining when a change in detected current is at least equal to a 0.04 milli-amp change for a 2 kilo-volt incremental change in the applied voltage.

17. The method of claim 1, further comprising precisely regulating the voltage applied to the high voltage lead to a specified incremental applied voltage.

18. The method of claim 17, wherein precisely regulating the applied voltage further comprises:
measuring the applied voltage;
comparing the applied voltage to the specified incremental applied voltage;
determining a difference between the applied voltage and the specified incremental applied voltage;
generating a control signal corresponding to the determined difference between the applied voltage and the specified incremental applied voltage; and
regulating the applied voltage to a second applied voltage, the second applied voltage more closely equaling the specified incremental applied voltage.

19. The method of claim 1, wherein the detecting further comprises detecting the resistive current from at least a ground lead on the MOV arrester.

20. The method of claim 19, wherein an amount of margin is subtracted from a reference point of conduction.

21. The method of claim 1, wherein the detecting further comprises detecting harmonic components.

22. The method of claim 1, further comprising:
detecting a partial discharge; and
determining that the MOV arrester has failed the test when the partial discharge is detected.

23. The method of claim 1, further comprising:
applying a voltage to a grading shield that is oriented about a top region of the MOV arrester and to the high voltage lead of the MOV arrester;
detecting a leakage current across the MOV arrester;
determining a resistive current component from the detected leakage current;
comparing the resistive current component to a predefined criteria;
determining that when the resistive current component is greater than a second predefined criteria when the applied voltage is applied, the MOV arrester has failed the test; and
determining that when the resistive current component is less than or equal to the predefined criteria when the applied voltage is applied, the MOV arrester has passed the test.

24. A system for testing metal oxide varistor (MOV) arresters, comprising:
means for applying a plurality of applied voltages to a high voltage lead of the MOV arrester, the plurality of applied voltages being changed between an initial test voltage and final test voltage, the final test voltage corresponding to a point of conduction of a reference MOV arrester;
means for determining a resistive current through the MOV arrester for each of the applied voltages;
means for determining information corresponding to the resistive current when the applied test voltage corresponds to the point of conduction of the reference MOV arrester;
means for comparing the determined information with information associated with the point of conduction of the reference MOV arrester;
means for determining that the MOV arrester has passed the test when the determined information corresponds to the information associated with the reference MOV arrester; and
means for determining that the MOV arrester has failed the test when the determined information does not correspond to the information associated with the reference MOV arrester.

25. The system of claim 24, further comprising:
means for detecting a current through the MOV arrester for each of the applied voltages.

26. A program for testing metal oxide varistor (MOV) arresters stored on computer-readable medium, the program comprising logic configured to perform:
applying a plurality of applied voltages to a high voltage lead of the MOV arrester, the plurality of applied voltages being changed between an initial test voltage and final test voltage, the final test voltage corresponding to a point of conduction of a reference MOV arrester;
determining a resistive current through the MOV arrester for each of the applied voltages;
determining information corresponding to the resistive current when the applied test voltage corresponds to the point of conduction of the reference MOV arrester;
comparing the determined information with information associated with the point of conduction of the reference MOV arrester;

determining that the MOV arrester has passed the test when the determined information corresponds to the information associated with the reference MOV arrester; and determining that the MOV arrester has failed the test when the determined information does not correspond to the information associated with the reference MOV arrester; and indicating whether the MOV arrester has passed or failed the test.

27. The program of claim 26, further comprising logic configured to perform:

comparing the applied voltage to a specified incremental applied voltage;

determining a difference between the applied voltage and the specified incremental applied voltage; and generating a control signal corresponding to the determined difference between the applied voltage and the specified incremental applied voltage to cause regulation of the applied voltage to second applied voltage, the second applied voltage more closely equaling the specified incremental applied voltage.

28. The program of claim 26, further comprising logic configured to perform:

detecting the applied voltage across the MOV arrester; and determining a resistive current component from the detected leakage current and applied voltage.

29. The program of claim 26, further comprising logic configured to perform:

receiving information corresponding to the applied voltage across the MOV arrester; and determining a resistive current component from the detected leakage current and applied voltage information.

30. The program of claim 26, wherein the determined information is a current value (It) determined at the final test voltage value that corresponds to a conduction voltage (Vx,r) of the reference MOV arrester, and wherein the information associated with the reference MOV arrester is a conduction current (Ix,r), such that the MOV arrester has passed the test when (It) is less than or equal to a predefined current corresponding to (Ix,r), and such that the MOV arrester has failed the test when (It) is greater than the predefined current.

31. The program of claim 26, wherein the determined information is a voltage value (Vt) determined at the final test voltage value that corresponds to a conduction current (Ix,r) of the reference MOV arrester, and wherein the information associated with a reference MOV arrester is the conduction voltage (Vx,r), such that the MOV arrester has passed the test when (Vt) is greater than or equal to a predefined voltage corresponding to (Vx,r), and such that the MOV arrester has failed the test when (Vt) is less than the predefined voltage.

32. The program of claim 26, wherein the determined information is a current value (It) determined at the final test voltage value that corresponds to a point of conduction of the MOV arrester, and wherein the information associated with the reference MOV arrester is a conduction current (Ix,r), such that the MOV arrester has passed the test when (It) is less than or equal to a predefined current corresponding to (Ix,r), and such that the MOV arrester has failed the test when (It) is greater than the predefined current.

33. The program of claim 26, wherein the determined information is a voltage value (Vt) determined at the final test voltage value that corresponds to a point of conduction of the MOV arrester, and wherein the information associated with the reference MOV arrester is a conduction voltage (Vx,r), such that the MOV arrester has passed the test when (Vt) is greater than a predefined voltage corresponding to (Vx,r), and such that the MOV arrester has failed the test when (Vt) is less than or equal to the predefined voltage.

34. The program of claim 26, further comprising logic configured to perform:

detecting a current through the MOV arrester for each of the applied voltages.

35. The program of claim 26, further comprising logic configured to perform:

applying voltages in step-wise manner by a predefined incremental amount.

36. The program of claim 26, further comprising logic configured to perform:

applying voltages in a continuous manner and concurrently sampling current through the MOV arrester and the test voltage.

37. The program of claim 26, wherein the logic configured to perform applying the plurality of applied voltages further comprises logic configured to perform increasing the applied voltages by a predefined incremental amount in step-wise manner.

38. The program of claim 37, wherein the logic configured to perform increasing the plurality of applied voltages comprises starting with a first voltage of zero volts.

39. The program of claim 37, wherein the logic configured to perform increasing the plurality of applied voltages comprises starting with a first voltage equal to a predetermined voltage.

40. The program of claim 37, wherein the logic configured to perform increasing the plurality of applied voltages further comprises starting with a first voltage equal to a selected voltage.

41. The program of claim 26, further comprising logic configured to perform:

indicating on a display the failing or the passing of the test.

42. The program of claim 26, wherein the logic configured to perform determining the point of conduction further comprises logic for determining when a change in detected current is at least equal to a 0.04 milli-amp change for a 2 kilo-volt incremental change in the applied voltage.

43. The program of claim 26, further comprising logic for precisely regulating the voltage applied to the high voltage lead to a specified incremental applied voltage.

44. The program of claim 43, wherein the logic for precisely regulating the applied voltage further comprises logic configured for:

measuring the applied voltage;

comparing the applied voltage to the specified incremental applied voltage;

determining a difference between the applied voltage and the specified incremental applied voltage;

generating a control signal corresponding to the determined difference between the applied voltage and the specified incremental applied voltage; and regulating the applied voltage to a second applied voltage, the second applied voltage more closely equaling the specified incremental applied voltage.

45. The program of claim 26, wherein the logic configured to perform detecting further comprises logic configured to perform detecting the resistive current from at least a ground lead on the MOV arrester.

46. The program of claim 45, wherein an amount of margin is subtracted from a reference point of conduction.

47. The program of claim 26, wherein the logic configured to perform detecting further comprises logic configured to perform detecting harmonic components.

48. The program of claim 26, further comprising logic configured to perform:
- detecting a partial discharge; and
- determining that the MOV arrester has failed the test when the partial discharge is detected.

49. The program of claim 26, further comprising logic configured to perform:
- applying a voltage to a grading shield that is oriented about a top region of the MOV arrester and to the high voltage lead of the MOV arrester;
- detecting a leakage current across the MOV arrester;
- determining a resistive current component from the detected leakage current;
- comparing the resistive current component to a predefined criteria;
- determining that when the resistive current component is greater than a second predefined criteria when the applied voltage is applied, the MOV arrester has failed the test; and
- determining that when the resistive current component is less than or equal to the predefined criteria when the applied voltage is applied, the MOV arrester has passed the test.

* * * * *

UNITED STATES PATENT AND TRADEMARK OFFICE
CERTIFICATE OF CORRECTION

| | | |
|---|---|---|
| PATENT NO. | : 7,167,007 B2 | Page 1 of 1 |
| APPLICATION NO. | : 11/099909 | |
| DATED | : January 23, 2007 | |
| INVENTOR(S) | : Coffeen et al. | |

It is certified that error appears in the above-identified patent and that said Letters Patent is hereby corrected as shown below:

In column 2,
    line 18, delete "currents" and replace with --current--.
In column 6,
    line 38, delete "to determined error" and replace with --to the determined error--.
In column 10,
    line 36, delete "reverence" and replace with --reference--;
    line 52, delete "reverence" and replace with --reference--; and
    line 53, delete "reverence" and replace with --reference--.
In column 11,
    line 5, delete "similar the reference" and replace with --similar to the reference--;
    line 28, delete "FIG. 6*c*" and replace with --FIG. 6C--;
    line 34, delete "test current (It) is" and replace with --test current (It) at 626 is--; and
    line 56, delete "test voltage (Vt) is" and replace with --test voltage (Vt) at 628 is--.
In column 12,
    line 60, delete "displayed".
In column 15,
    line 33, delete "the slope of the slope" and replace with --the slope of--.
In column 18,
    line 27, delete "and".
In column 21,
    line 4, delete "and".

Signed and Sealed this

Fourth Day of September, 2007

JON W. DUDAS
*Director of the United States Patent and Trademark Office*